United States Patent
Ross et al.

(10) Patent No.: US 7,277,291 B2
(45) Date of Patent: Oct. 2, 2007

(54) THERMAL TRANSFER DEVICE

(75) Inventors: Daniel T. Ross, Los Altos, CA (US); Donn D. Gooch, Milpitas, CA (US); Simon Chang, Fremont, CA (US)

(73) Assignee: Verifone Holdings, Inc., San Jose, CA (US)

(*) Notice: Subject to any disclaimer, the term of this patent is extended or adjusted under 35 U.S.C. 154(b) by 162 days.

(21) Appl. No.: 11/199,681

(22) Filed: Aug. 8, 2005

(65) Prior Publication Data
US 2007/0030656 A1   Feb. 8, 2007

(51) Int. Cl.
*H05K 7/20* (2006.01)
(52) U.S. Cl. .................. 361/710; 361/700; 361/701; 361/709; 165/80.3; 165/80.4; 165/104.33
(58) Field of Classification Search ........ 361/688–690, 361/698–699, 703–707, 715, 719, 717, 718, 361/722; 165/80.2–80.4, 185; 257/721, 257/720, 714, 722, 717; 62/259.2; 174/16.3
See application file for complete search history.

(56) References Cited

U.S. PATENT DOCUMENTS

| | | | |
|---|---|---|---|
| 3,993,123 A | 11/1976 | Chu et al. | |
| 4,381,032 A | 4/1983 | Cutchaw | |
| 4,448,240 A | 5/1984 | Sharon | |
| 4,498,530 A | 2/1985 | Lipschutz | |
| 4,639,829 A | 1/1987 | Ostergren et al. | |
| 4,753,287 A | 6/1988 | Horne | |
| 4,770,242 A * | 9/1988 | Daikoku et al. ............ 165/185 |
| 5,133,403 A * | 7/1992 | Yokono et al. ............ 165/185 |
| 5,162,974 A | 11/1992 | Currie | |
| 5,345,107 A * | 9/1994 | Daikoku et al. ............ 257/717 |
| 5,463,529 A | 10/1995 | Chia et al. | |
| 5,515,912 A * | 5/1996 | Daikoku et al. ........... 165/80.4 |
| 5,595,240 A | 1/1997 | Daikoku et al. | |
| 5,705,850 A * | 1/1998 | Ashiwake et al. .......... 257/714 |
| 5,730,210 A * | 3/1998 | Kou .......................... 165/80.3 |

(Continued)

OTHER PUBLICATIONS

The Article: "Water-Cooled Circuit Module With Grooves Forming Passages Ner Heat-Producing Devices" IBM Technical Disclosure Bulletin, May 1989,☐☐US vol. 31; Issue 12; pp. 49-50.*

(Continued)

*Primary Examiner*—Michael Datskovskiy
(74) *Attorney, Agent, or Firm*—Kolisch Hartwell, P.C.

(57) ABSTRACT

A thermal conducting device removes heat from a power dissipating device installed within a case, and includes a base coupled to the power dissipating device and a translational portion that is movable in a vertical dimension. The translational portion couples at an upper surface to the inner surface of the case panel. A cavity and piston in the base and the translating portion may provide complementary guide surfaces to constrain movement of the translational portion generally to a vertical dimension. A biasing element may urge the translational portion upward. The translational portion and the external panel may allow movement of their respective surfaces relative to one another. The cavity may include a port allowing air to pass into and out of the cavity. The upper surface of the translational portion may be tiltable with respect to the base. An adhesive layer may couple the base and the power dissipating device.

37 Claims, 2 Drawing Sheets

U.S. PATENT DOCUMENTS

| | | | |
|---|---|---|---|
| 5,751,062 A * | 5/1998 | Daikoku et al. | 257/722 |
| 5,774,334 A * | 6/1998 | Kawamura et al. | 361/699 |
| 6,144,092 A | 11/2000 | Kappes et al. | |
| 6,245,186 B1 | 6/2001 | Alcoe et al. | |
| 6,381,844 B1 | 5/2002 | Bollesen | |
| 6,501,658 B2 | 12/2002 | Pearson et al. | |
| 6,545,870 B1 | 4/2003 | Franke et al. | |
| 6,549,410 B1 | 4/2003 | Cohen | |
| 6,654,250 B1 | 11/2003 | Alcoe | |
| 6,680,849 B2 | 1/2004 | Atkinson et al. | |
| 6,695,042 B1 | 2/2004 | Boudreaux et al. | |
| 6,755,797 B1 | 6/2004 | Stouffer | |
| 6,765,798 B1 | 7/2004 | Ratliff et al. | |

OTHER PUBLICATIONS

The Article: "Enhanced Thermal Conduction Piston" IBM Technical Disclosure Bulletin, US vol. 24; Issue 12; pp. 6453-6454.*

* cited by examiner

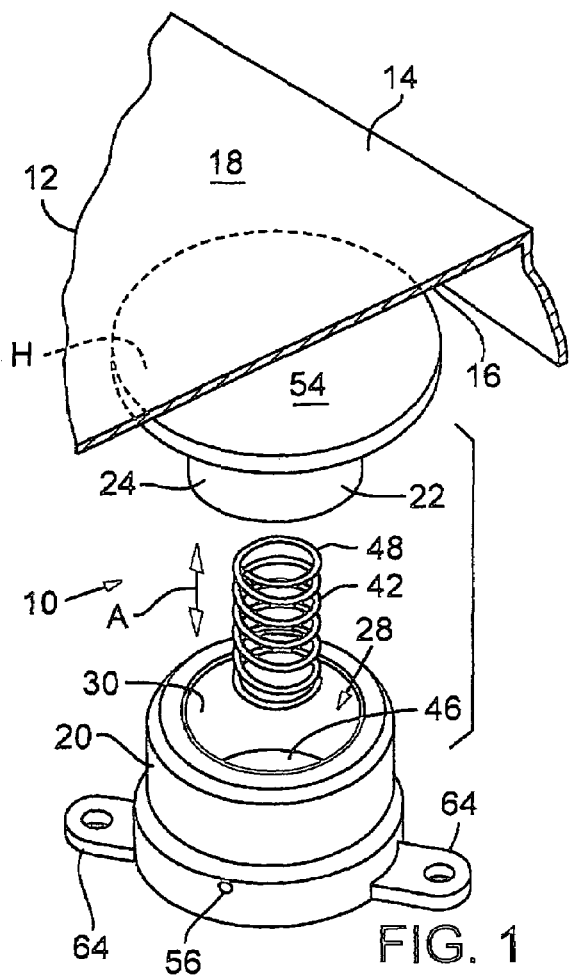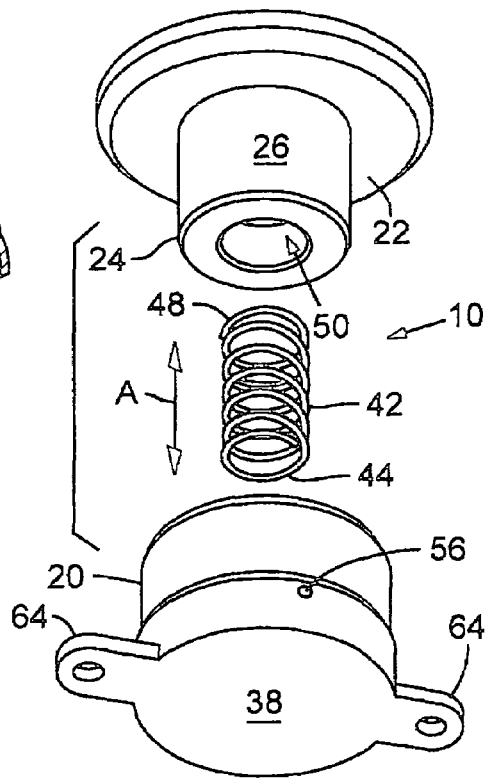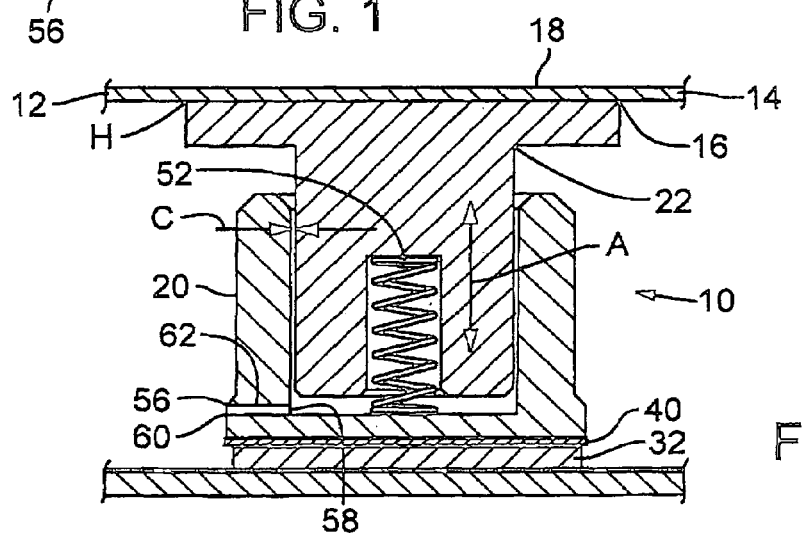

THERMAL TRANSFER DEVICE

BACKGROUND

The present invention relates to a device for transferring heat from a heat source installed in a case to a panel of the case. The heat-transferring device conforms to variations in the relative positioning of the heat source and the case panel. The device may correct for variations in the distance between the heat source and case panel and in the alignment of the heat source and case panel. The device may also allow for removal and for movement side-to-side and inwardly and outwardly of the case panel without removal, disconnection, or disassembly of the heat-transferring device.

SUMMARY

Heat sources, such as microprocessors, that require external cooling are typically installed in a case, such as a computer case or a case for a point-of-sale terminal. The heat from the microprocessor may need to be transferred away from the microprocessor and out of the case to allow for normal operation of the microprocessor and the other components of the computer or terminal. The microprocessor is typically mounted on a PC board opposite an external panel of the case.

The case panel may be used to dissipate heat from the microprocessor and to emit the heat to the external environment. To improve such heat dissipation, a heat sink could be coupled between the microprocessor and the case panel, but several challenges arise.

The terminal or computer case will be expected to undergo physical shock, for example as would result from the case falling from a counter or tabletop to the floor. Such shock is expected to cause compressive deflection of the case panel inwardly and outwardly as well as side-to-side motion of the panel relative to internal components.

The case panel is typically formed at least in part of a thermally conductive metallic material (some portions may be plastic) and will survive such shock. However, the internal components, including the microprocessor, its mounting to the PC board, and the PC board and its mechanical coupling to the case are typically less rugged than the panel and must be insulated to some extent from such shock. If a heat sink is coupled between the microprocessor and the panel then it will form a conduit for transferring physical shock from the case panel to the microprocessor, which could cause mechanical failure of the microprocessor or other internal components.

The panels of the terminal or computer case will also need to be assembled and disassembled. During typical assembly, the PC board, with microprocessor mounted thereon, is installed first in the case, and then the case panel is installed to enclose the microprocessor and other components. If a heat sink is to be coupled between the microprocessor and the panel, it will need to be aligned with the microprocessor and with the panel and provide for physical contact or at least close proximity with each. The alignment of the heat sink with the microprocessor and the case panel will add to the assembly time and cost.

Various tolerances in the positioning of the PC board, microprocessor, and case panel also make such alignment difficult. Ideally, the PC board and the case panel have surfaces that are in parallel planes. However, typically, a variable angle exists between the plane of the PC board, and thus the microprocessor, and the plane of the case panel. Also, the distance between the microprocessor and the panel may vary due to variations in component size and in positioning of the PC board and its associated connectors.

The present invention is for use in such a case with such a panel where the panel includes an inner surface that is substantially flat or unobstructed, i.e., that lacks any obstacle to movement of a corresponding structure along the inner surface of the case panel within a specified range. The invention provides a thermal conducting device for removing heat from a power dissipating device inside the case by thermally coupling to the power dissipating device at a base surface of the thermal conducting device. The thermal conducting device may include a translational portion that is movable with respect to the base in a vertical dimension. The translational portion may include an upper surface that has a corresponding shape to that of the inner surface of the case panel. For example, if the inner surface of the case panel is substantially flat, then the upper surface of the translational portion is correspondingly substantially flat. Other configurations of the surfaces may be used, preferably providing for relative movement between the translation portion of the thermal conducting device and the case panel.

The invention may be formed with a substantially cylindrical cavity in the base of the thermal conducting device, in which case the translating portion includes correspondingly shaped cylindrical piston. Alternatively, the cavity may be in the translational portion and the piston disposed on the base. In either embodiment, the cylindrical cavity preferably provides a guide surface that is substantially vertical and substantially straight in a vertical dimension, and the piston provides a guide surface complementary to the guide surface of the cavity. The guide surfaces thus cooperate to constrain movement of the translational portion generally to the vertical dimension. The thermal conducting device may include a biasing element for urging the translational portion upward into contact with the inner surface of the external panel.

Thus, in operation, the device provides for the conducting of heat from the power dissipating device to the external panel, and the translational portion and external panel are preferably in contact while allowing for movement of the translational portion and external panel relative to one another.

The thermal conducting device of the present invention may also include in the cavity a port that allows air to pass into and out of the cavity while the translational portion moves relative to the base.

The present invention may also include, in the embodiment with the substantially cylindrical cavity, a clearance between the piston and the cylindrical cavity to allow the translational portion to be tiltable with respect to the base in two degrees-of-freedom from a nominally horizontal position.

The thermal conducting device may also include an adhesive layer on a lower surface of the base for adhesive coupling between the base and the power dissipating device. Alternatively, or in addition, the base may include at least two mounts for fastening the base to the PC board adjacent the power dissipating device

BRIEF DESCRIPTION OF THE DRAWINGS

FIG. 1 is an exploded isometric view of an embodiment of a thermal conducting device according to the present invention, showing a base with a cylindrical cavity and a port, a translational portion with a piston for fitting into the cylindrical cavity, and a spring for urging the translational portion upward so that its upper surface contacts an inner surface of an external panel of a case.

FIG. 2 is an exploded isometric view of the embodiment shown in FIG. 1, showing a lower surface of the base of the thermal conducting device and a cavity in the piston for receiving the spring.

FIG. 3 is a side cross-sectional view of the embodiment of FIGS. 1 and 2 showing the alignment and the clearance of the piston in the cylindrical cavity, as well as a power dissipating device mounted on a printed circuit board beneath the base of the thermal conducting device, and also showing the first and second ends of the port and the channel therebetween, and further showing the travel of the translational portion in a vertical dimension.

DETAILED DESCRIPTION OF THE PREFERRED EMBODIMENTS

Figure 4:
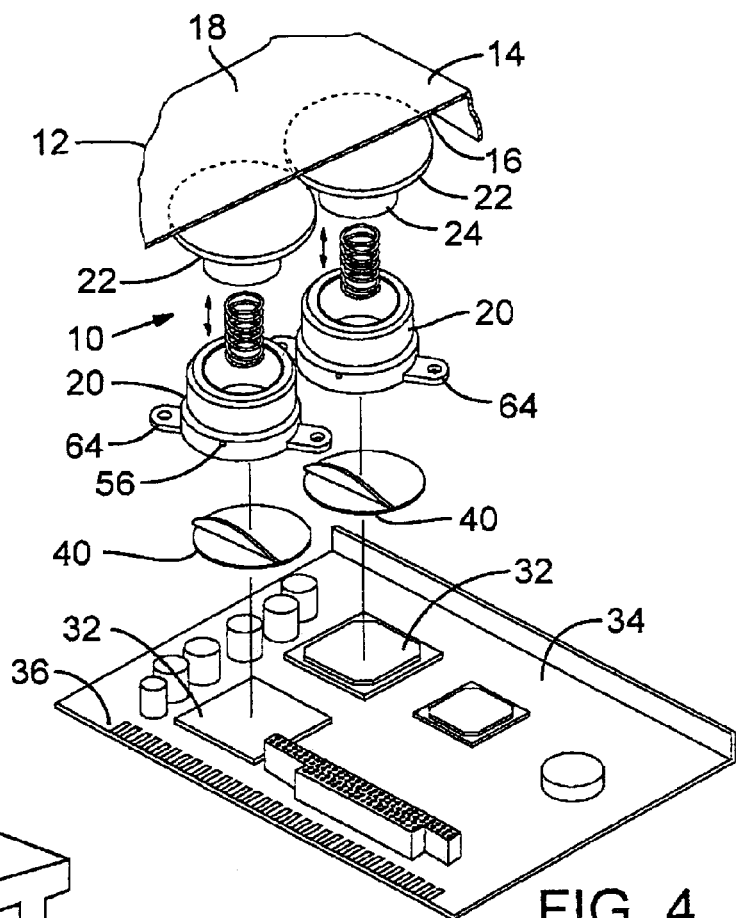
FIG. 4 is an exploded isometric view of two of the thermal conducting devices for installation on a PC board with two power dissipating devices, and also showing two adhesive layers, each for installation between the base of one of the thermal conducting device and one of the power dissipating devices.

As shown in FIG. 1, the present invention is a thermal-conducting device, indicated generally at 10, for use in a case 12, such as for a computer, a point-of-sale terminal, or other equipment that contains electronic components. Case 12 includes an external panel 14 with an inner surface 16 and an outer surface 18. Inner surface 16 of panel 14 is preferably substantially flat, meaning it lacks obstacles, particularly in the area adjacent thermal-conducting device 10, that would inhibit relative motion of device 10 and panel 14.

Thermal-conducting device 10 includes a base portion 20 and a translational portion 22 that may be movable with respect to the base portion. Preferably translational portion 22 is movable in a vertical dimension as indicated by arrows A in FIGS. 1-3. Typical ranges of motion in the vertical dimension will depend on the particular application of the invention. In a point-of-sale terminal, typical ranges are from about 3 mm to about 5 mm. In other applications as little as 1 mm or less of vertical travel may be desirable, or as much as 2 inches or more.

As shown in FIGS. 1-4, translational portion 22 may include a piston 24 defining a substantially cylindrical outer surface 26. Base portion 20 may include a substantially cylindrical cavity 28 defining an inner surface 30. Piston 24 may be sized to fit into cavity 28, and inner surface 30 may provide a guide surface that is substantially vertical and substantially straight in the vertical dimension A. Outer surface 26 of piston 24 provides a guide surface complementary to the guide surface provided by the cavity. Outer surface 26 is also typically substantially vertical and substantially straight in the vertical dimension A. Thus, the guide surfaces cooperate to constrain movement of translational portion 22 generally to the vertical dimension. Alternatively, the piston may be provided on the base portion and the cavity for receiving the piston may be in the translational portion. Preferably cooperating cylindrical shapes are used, although any suitable shape or configuration may be used, e.g., that shown in FIGS. 5 and 6.

Thermal conducting device 10 may be used to remove heat from a power dissipating device, such as microprocessor 32, shown in FIGS. 3 and 4. Microprocessor 32 may be installed on a printed circuit (PC) board 34 mounted by edge connector 36 or other suitable means inside case 12. Base portion 20 includes a lower surface 38 (FIG. 2) that is preferably substantially flat, or such other shape as is beneficial for thermally coupling to microprocessor 32. Base portion 20 is typically disposed over microprocessor 32, and may be coupled to the microprocessor by an adhesive layer 40, preferably a tape with enhanced thermal conductivity, such as 8805 tape made by 3M®, or an equivalent product, such as T412 tape made by Chomerics. Alternatively, a conformal pad, preferably with enhanced thermal conductivity, may be placed between microprocessor 32 and base portion 20.

Thermal conducting device 10 may include a biasing element, such as spring 42, preferably disposed in cylindrical cavity 28 in base portion 20, with a lower end 44 in contact with an inner lower surface 46 of base portion 20. An upper end 48 of spring 42 preferably extends into an aperture 50 in piston 24 and contacts an inner upper surface 52 of translational portion 22. Spring 42 preferably urges the translational portion upward into contact with inner surface 16 of external case panel 14 at a substantially flat upper surface 54 of translational portion 22.

Thus the complementary surfaces of the translational portion and the case panel are in contact, and the translational portion may press against the case panel under pressure as provided by biasing element 42. However, the surfaces are otherwise unconnected and the case panel remains free for removal from the case and to allow motion of the case panel in the case of mechanical shock or other force. Such motion includes both an inward or outward deflection of the case panel, i.e., moving roughly in vertical dimension A. Such motion also includes movement of case panel 14 relative to translational portion 22 in a horizontal plane H defined by the meeting in a nominal position of upper surface 54 of translational portion 22 and inner surface 16 of panel 14 (FIG. 3). The magnitude of movement of panel 14 in plane H relative to translational portion depends on the structure of case 12, but is not limited by the complementary surfaces of the panel and the translational portion. Typical values for such movement in a point-of-sale terminal are on the order of about ⅛-inch.

As noted above, PC board 34 and panel 14 are typically roughly parallel, in which case upper surface 54 of translational portion 22 is parallel to inner surface 16 of panel 14 when translational portion 22 is a nominal, vertical position. However, manufacturing tolerances for the case, PC board, and other factors may allow an angular offset between the surfaces in the nominal position. Thermal conducting device 10 may include a clearance C (FIG. 3) between guide surface 30 of base portion 20 and guide surface 26 of translational portion 22 which allows translational portion 22 to tilt with respect to the base portion. Such tilting is preferably available, e.g., in the cylindrical embodiment, in two degrees of freedom, thus allowing upper surface 54 of translational portion 22 to be in direct contact with inner surface 16 of panel 14 across substantially all of upper surface 54.

Clearance C is preferably no more than about 0.2 mm, or about 0.008 inches, but may be selected to be other values depending on appropriate factors such as the amount of tilting to be allowed, the desired travel of the translational portion in the vertical dimension, the frictional characteristics of the base and translational portions, and whether a lubricant such as grease will be used in cavity 28. Clearance in a point-of-sale terminal may be as little 0.14 mm, or about 5 thousands of an inch. If a lubricant is used then typically a larger clearance C will be desirable.

The typical angle at which translational portion can tilt is between about 0.5° and about 4°, and preferably is about 1°.

As noted, a lubricant, such as grease may be applied to the guide surfaces in cavity 28 and on piston 22. Preferably such grease has enhanced thermal conductivity, such as suitable grease made by Radio Shack® or made by Arctic Silver® under the Ceramique® brand.

The damping and shock absorbing characteristics of thermal conducting device 10 depend on a number of characteristics, including the strength of biasing element 42, and also the extent to which air is allowed by clearance C to pass between the guide surfaces of piston 22 and cylindrical cavity 28. The damping and rebound characteristics of device 10 may be altered by adding a port 56 to allow air to pass in and out of cavity 28. As best seen in FIG. 3, port 56 includes a first end 58 in cavity 28, a second end 60 on the outside of base portion 22 and a channel 62 communicating between the first and second ends. The diameter of port 56 may be made small if a greater degree of damping is preferred, or larger for less damping.

Base portion 20 may be pressed onto the microprocessor by fasteners (not shown) inserted though mounts, such as two mounting ears 64, included on base portion 20, and into PC board 34. Such mounts may be used alternatively to adhesive layer 40 or in addition. A conformal pad, preferably with enhanced thermal conductivity, may be placed between microprocessor 32 and base portion 20, in place of, or in addition to, adhesive layer 40. Such a conformal pad may also be used for coupling between upper surface 54 of translating portion 22 and inner surface 16 of external panel 14.

Any suitable material may be used for the components of thermal-conducting device 10, preferably materials with high thermal conductivity, such as copper or, more preferably, aluminum, such as 6063 aluminum. The components may be manufactured by any suitable process, preferably, in the case of the embodiment of FIGS. 1-4, from extruded aluminum pipe.

Figure 5:
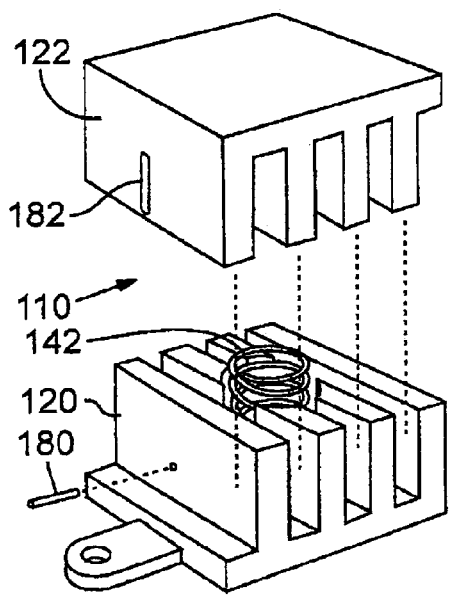
FIG. 5 is an exploded isometric view of another embodiment of the present invention including a generally rectangular base with spaced fins and a generally rectangular translational portion with fins for interleaving with those of the base, and also a pin on the base with a corresponding slot on the translational portion for maintaining a coupling between the base and the translational portion.
Figure 6:
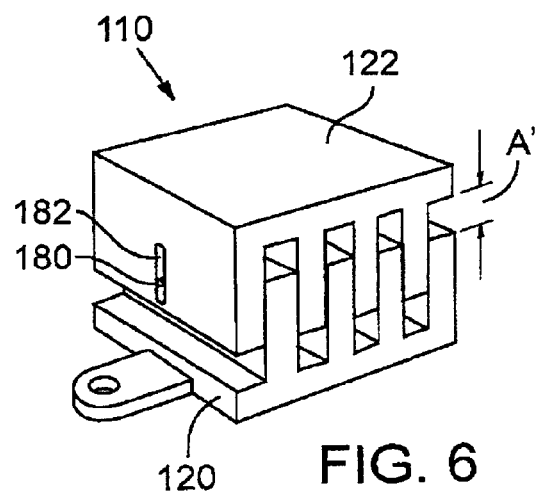
FIG. 6 is an assembled isometric view of the embodiment of FIG. 5, showing the pin in the slot and the travel of the translational portion in a vertical dimension.

An alternative embodiment of the present invention is shown in FIGS. 5 and 6 where a thermal conducting device 110 has a substantially rectangular outer dimension and is formed with a base portion 120 with upward facing fins and a translational portion 122 with downward facing fins that interleave to provide for thermal conduction. Translational portion 122 is urged upward by a spring 142 and is movable in vertical dimension, indicated by arrows A'. A guide pin 180 and mating slot 182 may be provided on the base and translational portions to limit the motion of the translational portion. Device 110 is configured to be mounted in a case for thermal conduction of heat from a power dissipating device to an external panel in a manner corollary to that for the embodiment of FIGS. 1-4.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. No single feature, function, element or property of the disclosed embodiments is essential to all of the disclosed inventions. Similarly, where the following claims, and any subsequently presented claims in this or a related application, recite "a" or "a first" element or the equivalent thereof, such claims should be understood to include incorporation of one or more such elements, neither requiring nor excluding two or more such elements.

The claims particularly point out certain combinations and subcombinations that are directed to one of the disclosed inventions and are novel and non-obvious. Inventions embodied in other combinations and subcombinations of features, functions, elements and/or properties may be claimed through amendment of such claims or presentation of new claims in a related application. Such amended or new claims, whether they are directed to a different invention or directed to the same invention, whether different, broader, narrower or equal in scope to the original claims, are also included within the subject matter of the inventions of the present disclosure.

We claim:

1. A thermal conducting device for removing heat from a power dissipating device, wherein the power dissipating device is installed within a case having an external panel that includes a substantially flat inner surface, the thermal conducting device comprising:

a base configured to be thermally coupled to the power dissipating device, the base including a lower surface for disposing over the power dissipating device;

a translational portion that is movable with respect to the base in a vertical dimension, the translational portion including a substantially flat upper surface for coupling to the inner surface of the external panel;

a cavity provided in one of the base and the translating portion and a piston disposed on the other one of the base and the translating portion, wherein the cavity provides a guide surface that is substantially vertical and substantially straight in a vertical dimension, and the piston provides a guide surface complementary to the guide surface of the cavity, the guide surfaces cooperating to constrain movement of the translational portion generally to the vertical dimension, further wherein the one of the base or the translating portion that includes the cavity further includes a port defining a first end and a second end and a channel communicating therebetween, wherein the first end opens into the cavity and the second end opens adjacent an external surface of the base or the translating portion, the port allowing air to pass into and out of the cavity; and a biasing element for urging the translational portion upward into contact with the inner surface of the external panel, whereby the substantially flat upper surface of the translational portion and the substantially flat inner surface of the external panel are in contact, and wherein the substantially flat surfaces provide for movement of the surfaces relative to one another.

2. The thermal conducting device of claim 1 wherein the cavity and the piston are substantially cylindrical.

3. The thermal conducting device of claim 1 wherein the translational portion is movable in the vertical dimension with respect to the base at least about 1 mm.

4. The thermal conducting device of claim 1 wherein the translational portion is movable in the vertical dimension with respect to the base at least about 3 mm.

5. The thermal conducting device of claim 1 wherein the lower surface of the base is in direct contact with the power dissipating device.

6. The thermal conducting device of claim 1 wherein the lower surface of the base is substantially flat.

7. The thermal conducting device of claim 1 further comprising an adhesive layer on the lower surface of the base for adhesive coupling between the base and the power dissipating device.

8. The thermal conducting device of claim 1 wherein the base and the translational portion are substantially formed of aluminum.

9. The thermal conducting device of claim 1 wherein a clearance between the guide surface of the base portion and the guide surface of the translational portion is no more than about 0.2 mm.

10. The thermal conducting device of claim 1 wherein the translational portion is tiltable with respect to the base portion to an angle of at least about 1°.

11. The thermal conducting device of claim 1 wherein the base further includes at least two mounting ears for coupling the base to the power dissipating device.

12. The thermal conducting device of claim 1 further including a thermally-conductive conformal pad for coupling between the lower base surface and the power dissipating device.

13. The thermal conducting device of claim 1 further including a thermally-conductive conformal pad for coupling between the upper surface of the translating portion and the inner surface of the external panel.

14. A thermal conducting device for removing heat from a power dissipating device, wherein the power dissipating device is installed within a case having an external panel that includes a substantially flat inner surface, the thermal conducting device comprising:
 a base configured to be thermally coupled to the power dissipating device, the base including a lower surface for disposing over the power dissipating device;
 a translational portion that is movable with respect to the base in a vertical dimension, the translational portion including an upper surface that is substantially flat for coupling to the substantially flat inner surface of the external panel;
 a substantially cylindrical cavity provided in one of the base and the translating portion and a substantially cylindrical piston disposed on the other one of the base and the translating portion, wherein the cylindrical cavity provides a guide surface that is substantially vertical and substantially straight in a vertical dimension, and the piston provides a guide surface complementary to the guide surface of the cavity, the guide surfaces cooperating to constrain movement of the translational portion generally to the vertical dimension, further wherein the one of the base or the translating portion that includes the cavity further includes a port defining a first end and a second end and a channel communicating there between, wherein the first end opens into the cavity and the second end opens adjacent an external surface of the base or the translating portion, the port allowing air to pass into and out of the cavity; and
 a biasing element for urging the translational portion upward into contact with the inner surface of the external panel, whereby the substantially flat upper surface of the translational portion and the substantially flat inner surface of the external panel are in contact, and the substantially flat surfaces provide for movement of the surfaces relative to one another.

15. The thermal conducting device of claim 14 wherein the translational portion is movable in the vertical dimension with respect to the base at least about 1 mm.

16. The thermal conducting device of claim 14 wherein the translational portion is movable in the vertical dimension with respect to the base at least about 3 mm.

17. The thermal conducting device of claim 14 wherein the lower surface of the base is in direct contact with the power dissipating device.

18. The thermal conducting device of claim 14 wherein the lower surface of the base is substantially flat.

19. The thermal conducting device of claim 14 further comprising an adhesive layer on the lower surface of the base for adhesive coupling between the base and the power dissipating device.

20. The thermal conducting device of claim 14 wherein the base and the translational portion are substantially formed of aluminum.

21. The thermal conducting device of claim 14 wherein a clearance between the guide surface of the base portion and the guide surface of the translational portion is no more than about 0.2 mm.

22. The thermal conducting device of claim 14 wherein the translational portion is tiltable with respect to the base portion to an angle of at least about 1°.

23. The thermal conducting device of claim 14 wherein the base further includes at least two mounting ears for coupling the base to the power dissipating device.

24. The thermal conducting device of claim 14 further including a thermally-conductive conformal pad for coupling between the lower base surface and the power dissipating device.

25. The thermal conducting device of claim 14 further including a thermally-conductive conformal pad for coupling between the upper surface of the translating portion and the inner surface of the external panel.

26. A point-of-sale terminal comprising:
 a case having an external panel that includes a substantially flat inner surface;
 a power dissipating device installed within the case; and
 a thermal conducting device for removing heat from the power dissipating device, the thermal conducting device including a base configured to be thermally coupled to the power dissipating device, the base including a lower surface for disposing over the power dissipating device;
 the thermal conducting device further including a translational portion that is movable with respect to the base in a vertical dimension, the translational portion including a substantially flat upper surface for coupling to the inner surface of the external panel;
 the thermal conducting device further including a cavity provided in one of the base and the translating portion and a piston disposed on the other one of the base and the translating portion, wherein the cavity provides a guide surface that is substantially vertical and substantially straight in a vertical dimension, and the piston provides a guide surface complementary to the guide surface of the cavity, the guide surfaces cooperating to constrain movement of the translational portion generally to the vertical dimension, further wherein the one of the base or the translating portion that includes the cavity further includes a port defining a first end and a second end and a channel communicating therebetween, wherein the first end opens into the cavity and the second end opens adjacent an external surface of the base or the translating portion, the port allowing air to pass into and out of the cavity; and the thermal conducting device further including a biasing element for urging the translational portion upward into contact with the inner surface of the external panel, whereby the substantially flat upper surface of the translational portion and the substantially flat inner surface of the external panel are in contact, and wherein the substantially flat surfaces provide for movement of the surfaces relative to one another.

27. The point-of-sale terminal of claim 26 wherein the translational portion is movable in the vertical dimension with respect to the base at least about 1 mm.

28. The point-of-sale terminal of claim 26 wherein the translational portion is movable in the vertical dimension with respect to the base at least about 3 mm.

29. The point-of-sale terminal of claim 26 wherein the lower surface of the base is in direct contact with the power dissipating device.

30. The point-of-sale terminal of claim 26 wherein the lower surface of the base is substantially flat.

31. The point-of-sale terminal of claim 26 further comprising an adhesive layer on the lower surface of the base for adhesive coupling between the base and the power dissipating device.

32. The point-of-sale terminal of claim 26 wherein the base and the translational portion are substantially formed of aluminum.

33. The point-of-sale terminal of claim 26 wherein a clearance between the guide surface of the base portion and the guide surface of the translational portion is no more than about 0.2 mm.

34. The point-of-sale terminal of claim 26 wherein the translational portion is tiltable with respect to the base portion to an angle of at least about 1°.

35. The point-of-sale terminal of claim 26 wherein the base further includes at least two mounting ears for coupling the base to the power dissipating device.

36. The point-of-sale terminal of claim 26 further including a thermally-conductive conformal pad for coupling between the lower base surface and the power dissipating device.

37. The point-of-sale terminal of claim 26 further including a thermally-conductive conformal pad for coupling between the upper surface of the translating portion and the inner surface of the external panel.

* * * * *